United States Patent
Ching et al.

(10) Patent No.: US 9,903,049 B2
(45) Date of Patent: Feb. 27, 2018

(54) SILICON HAIRSPRING

(71) Applicant: Master Dynamic Limited, Shatin New Territories (HK)

(72) Inventors: Ho Ching, Kowloon (HK); Pui Hang Ko, New Territories (HK)

(73) Assignee: Master Dynamic Limited, Hong Kong (HK)

( * ) Notice: Subject to any disclaimer, the term of this patent is extended or adjusted under 35 U.S.C. 154(b) by 0 days.

(21) Appl. No.: 15/045,159

(22) Filed: Feb. 16, 2016

(65) Prior Publication Data

US 2016/0238994 A1    Aug. 18, 2016

(30) Foreign Application Priority Data

Feb. 17, 2015   (HK) .................................. 15101776.1

(51) Int. Cl.
  *G04B 17/22*   (2006.01)
  *C30B 29/06*   (2006.01)
  (Continued)

(52) U.S. Cl.
  CPC .............. *C30B 29/06* (2013.01); *C30B 33/12* (2013.01); *G04B 1/145* (2013.01); *G04B 17/066* (2013.01); *G04B 17/227* (2013.01)

(58) Field of Classification Search
  CPC .... G04B 17/063; G04B 17/066; G04B 1/145; G04B 17/227; C30B 3/12; C30B 29/06
  See application file for complete search history.

(56) References Cited

U.S. PATENT DOCUMENTS

| | | | |
|---|---|---|---|
| 7,682,068 B2 * | 3/2010 | Bourgeois | G04B 17/066 368/169 |
| 8,002,460 B2 * | 8/2011 | Daout | G04B 17/066 368/175 |

(Continued)

FOREIGN PATENT DOCUMENTS

| | | |
|---|---|---|
| CN | 104345628 A | 2/2015 |
| DE | 10127733 A1 | 2/2003 |

(Continued)

OTHER PUBLICATIONS

European Patent Office, "Extended European Search Report" in connection with related European Patent Application No. 16155566, dated Jun. 6, 2016, 9 pages.

(Continued)

*Primary Examiner* — Sean Kayes
(74) *Attorney, Agent, or Firm* — Kolisch Hartwell, P.C.

(57) ABSTRACT

A torque-restoring element for an oscillator for a mechanical timepiece and having an oscillator frequency, said torque restoring element comprising a spiral spring body having a number N turnings with an inner terminal end for engagement with a rotational inertial element via a collet, and an outer terminal for engagement with a stationary cock element, and having a width, a height and a total arc length; wherein the spiral spring body includes a core formed from mono-crystalline silicon wafer oriented along the crystallographic axis <110>; and wherein the spiral spring body includes at least one peripheral coating of a material having a thermal elastic constant different from that of the core of the spiral spring body so as to maintain the oscillator frequency an oscillator including the torque-restoring element substantially insensitive to variations of ambient temperature.

18 Claims, 3 Drawing Sheets

(51) Int. Cl.
*G04B 17/06* (2006.01)
*C30B 33/12* (2006.01)
*G04B 1/14* (2006.01)

(56) References Cited

U.S. PATENT DOCUMENTS

| | | | |
|---|---|---|---|
| 8,354,032 B2 * | 1/2013 | Dinger | B81C 3/008 |
| | | | 216/2 |
| 8,393,783 B2 * | 3/2013 | Daout | G04B 17/20 |
| | | | 368/175 |
| 8,398,865 B2 * | 3/2013 | Dinger | B81C 99/008 |
| | | | 216/2 |
| 9,071,223 B2 * | 6/2015 | Hessler | G04B 17/227 |
| 9,411,314 B2 * | 8/2016 | Daout | G04B 17/345 |
| 2005/0281137 A1 | 12/2005 | Bourgeois et al. | |
| 2009/0236782 A1 | 9/2009 | Buhler et al. | |
| 2010/0290320 A1 | 11/2010 | Gygax et al. | |
| 2011/0037537 A1 | 2/2011 | Cusin et al. | |
| 2014/0219067 A1 | 8/2014 | Hessler | |

FOREIGN PATENT DOCUMENTS

| | | |
|---|---|---|
| EP | 0732635 A1 | 9/1996 |
| EP | 1422436 A1 | 5/2004 |
| EP | 1519250 A1 | 3/2005 |
| EP | 2105806 A1 | 9/2009 |
| EP | 2215531 A1 | 8/2010 |
| EP | 2224293 A2 | 9/2010 |
| EP | 2597536 A1 | 5/2013 |
| EP | 2755093 A2 | 7/2014 |
| JP | 2013210386 A | 10/2013 |
| WO | 2009068091 A1 | 6/2009 |

OTHER PUBLICATIONS

Hong Kong Intellectual Property Office, Search Report in connection with related Hong Kong Patent Application No. 15101776.1, dated Jun. 5, 2015, 2 pages.

Wang, Yigang, Authorized Officer, State Intellectual Property Office of the P.R. China, "International Search Report" in connection with related International Application No. PCT/CN2016/072851, dated Mar. 29, 2016, 4 pages.

Wang, Yigang, Authorized Officer, State Intellectual Property Office of the P.R. China, "Written Opinion of the International Searching Authority" in connection with related International Application No. PCT/CN2016/072851, dated Mar. 29, 2016, 9 pages.

European Patent Office, "Communication Pursuant to Article 94(3) EPC" in connection with related European Patent Application No. 16155566.9, dated Nov. 15, 2017, 4 pgs.

* cited by examiner

SILICON HAIRSPRING

TECHNICAL FIELD

The invention relates to spiral hairsprings, in particular hairsprings for timepiece made of silicon and design thereof.

BACKGROUND OF THE INVENTION

A hairspring is a key component of a mechanical timepiece. It is one of the two main components of an oscillator, the other being the balance wheel. The oscillator of a timepiece provides the means of time regulation via its simple harmonic motion. The balance wheel acts as the inertial element and is attached to the inner terminal of a spiral-shaped hairspring. The outer terminal of the hairspring is typically rigidly attached to a fixed stud. In an ideal oscillator, the hairspring provides a restoring torque to the balance wheel that is proportional to the wheel's angular displacement from an equilibrium position, and equations of motion describes this as a linear second-order system.

The equilibrium position is defined as the angular position of the balance wheel such that when the oscillator is static, the net torque applied by the hairspring on the balance wheel is zero. An oscillator is considered isochronous when its natural frequency is independent of its amplitude and other external factors, such as temperature variations, magnetic fields and the like. As the accuracy of the timepiece is largely determined by the stability of the oscillator's natural frequency, isochronism is one of the most important properties of a mechanical timepiece.

Historically, a hairspring has been considered one of the most challenging components to manufacture for a timepiece, in particular in respect of mechanical movements used in watches. It is required to flex continuously at a frequency typically from three to five Hertz, this being the frequency range of a modern day mechanical timepiece oscillator, for the entire lifespan of the timepiece before maintenance, typically several years. A hairspring is also one of the smallest components in a mechanical movement having a spiral strip width of typically in the range of from 30 to 40 microns.

A hairspring also has to be formed from materials that resist the effect of temperature variations on the material properties, especially the Young's modulus, so as to maintain correct time-keeping and minimize fluctuations.

Furthermore and with the increasing amount of electrical and magnetic fields due to the proliferation of consumer electronics, a modern-day hairspring also must be able to resist or substantially minimize the effect of magnetic fields thereon. This is due to accuracy and consistency of a hairspring's stiffness being a demanding parameter, whereby even a 0.1% stiffness variation can result in up to 1 minutes/day in timepiece inaccuracy, which would be unacceptable in the timepiece and watch industries, and those in the watch industry have historically expended much effort with a view to providing hairsprings which minimize such effects by way of design and manufacturing technology.

Traditional hairsprings are made of metal alloys beginning from hardened steel used by John Harrison nearly 300 years ago to Elinvar invented by Charles Guillaume in 1919 to most recently Nivarox invented by Dr. H. C. Reinhard Straumann. Nearly all modern hairsprings are made of some variation of Nivarox, an alloy based on iron and nickel. The hairsprings are manufactured in a drawing process where the strip material is drawn into a thin wire. The straight strips are then coiled into a spiral before being treated to stabilize the shape of the spiral. This process has several known disadvantages including:
(a) A drawing process is typically not a high precision technique, having a tolerance in the range of a few microns, a significant percentage of the hairspring strip width typically in the range of 30 to 40 microns, resulting in inconsistency of stiffness,
(b) Metal alloys such as Nivarox inherently have a tendency to creep and deform slightly after prolonged stress in use, such that the metal hairspring cannot maintain its original spiral shape after over a year of continuous operation, which may require adjustment and inevitably affects time-keeping accuracy, and
(c) Although the thermal elastic constant and magnetic sensitivity of materials Nivarox have been substantially reduced compared with earlier metallic hairsprings by heavy doping with trace elements such as chromium, these problems and shortcomings have not been completely eliminated.

With a view to address or minimise the aforementioned problems with Nivarox and other metal alloys and their manufacturing methods for hairspring, the past decade has seen the introduction of the use of silicon and micro-fabrication techniques in hairspring manufacture.

Silicon hairsprings are produced using the micro-fabrication process which can achieve sub-micron precision with significantly greater accuracy than conventional metal forming techniques such as drawing. Advantages of the use of silicon include the following:
(a) Such a material does not creep and oxidize over time in comparison with most metal alloys, thus maintaining mechanical properties and integrity,
(b) Such a material is entirely non-magnetic, and
(c) Temperature sensitivity may be minimized or substantially eliminated for normal operating parameters, by provision of a hairspring with a silicon core and a thin layer of silicon dioxide such that the net thermal elastic constant of a hairspring approaches zero.

The use of technology of fabricating silicon hairspring accordingly has had several advancements over the past decade including that as disclosed in document DE 10127733 (7 Jun. 2001) whereby it is disclosed the use of silicon micromechanical springs, in which mono-crystalline silicon, which is in the <100> or <111> plane, whereby both orientations are disclosed as being equally suitable. The spring is a spiral spring having a good resistance to large-scale thermal stresses as well as good stability in shape. A coating of silicon dioxide can also cover the springs as disclosed.

Document EP 1422436 (25 Jun. 2002) describes a method to reduce the thermal drift of a single spiral hairspring for a timepiece, so as to achieve a temperature coefficient approaching zero. The method and device use a spiral spring intended to equip the balance of a mechanical timepiece and is formed of a rod of the spiral cutting from a <100> mono-crystalline silicon wafer having first and second order thermal elastic constants, the turns of the coil spring having a width w and a thickness t, whereby a coating of silicon dioxide making it possible to minimize the thermal coefficients of the spring constant of the spiral spring. The spiral spring described thus ideally comprises a modulation of the width of the spring.

Document EP2224293 (29 Apr. 2004) discloses a timepiece movement comprising a regulating device comprising a balance wheel and a plane hairspring which may be formed from silicon. The plane hairspring comprising on its outer turn a stiffened portion arranged to cause the deformations of the turns to be substantially concentric. The stiffened portion ends before the outer end of the hairspring, and characterised in that the between a terminal portion of the outer turn and the last-but-one turn of the hairspring is large enough for said last-but-one turn to remain free radially during expansions of the hairspring up to amplitudes corresponding substantially to the maximum angle of rotation of the balance in the movement. This assists in maintaining the concentricity of the hairspring when in use, thus assisting in maintaining good timekeeping. It is disclosed that the silicon hairspring may be formed using the method of EP 0732635. This patent, in the name of Patek Philippe, is known to disclose the structure of its Spiromax® balance spring, as discussed below.

In 2006, Patek Philippe publicly released the Spiromax® balance spring made of Silinvar®. This hairspring is obtained by a vacuum oxidation process that allows it to compensate for temperature variations. The concentric nature (the symmetrical expansions and contractions of the balance spring in relation to its centre) is made possible by a terminal curve that is not turned up but rather has a noticeably thicker region at the outer end, as described and claimed in EP 2224293.

Document EP 2215531 (28 Nov. 2007) describes a mechanical oscillator for watchmaking, comprising a spiral spring formed from a mono-crystalline silicon (Si) is oriented along the crystallographic axis <111> which has a coating is selected to obtain a variation, as a function of the temperature, of the resilient torque of the spiral spring, compensating the variation in function of the temperature at the moment of inertia of the balance. This document uses a mono-crystalline silicon material of axis <111> in the same manner as <001> mono-crystalline silicon is used in EP 1422436 and a coating to provide a temperature insensitive hairspring, also in the manner that the Spiromax hairspring is formed from Silinvar with an oxide coating to provide a hairspring which is insensitive to temperature changes.

More recent silicon hairsprings have also been available, however such use has been limited commercially, and in view of the limited usage of silicon hairsprings for a significantly short period of time of less than a decade and not in widespread usage in comparison to metal alloy hairsprings which have been used prolifically for many decades, the long-term reliability and integrity of hairsprings formed from silicon has not as yet had the opportunity to be assessed and compared with the industry standard metal or metal alloy hairsprings such as the Nivorax metal alloy hairsprings.

OBJECT OF THE INVENTION

It is the objective of the present invention to provide a silicon hairspring which overcomes or at least ameliorates at least some of the deficiencies as associated with those of the prior art.

BRIEF SUMMARY OF THE INVENTION

In a first aspect, the present invention provides a torque-restoring element for an oscillator for a mechanical timepiece and having an oscillator frequency, said torque restoring element comprising a spiral spring body having a number N turnings with an inner terminal end for engagement with a rotational inertial element via a collet, and an outer terminal end for engagement with a stationary cock element, and having a width, a height and a total arc length; wherein the spiral spring body includes a core formed from mono-crystalline silicon wafer oriented along the crystallographic axis <110>; and wherein the spiral spring body includes at least one peripheral coating of a material having a thermal elastic constant different from that of the core of the spiral spring body so as to maintain the oscillator frequency including the torque-restoring element substantially insensitive to variations of ambient temperature.

Preferably, the spiral spring body is of a substantially rectangular cross-section. Preferably, then spiral spring body has a width of in the range of from 20 μm to 60 μm, a height of in the range of from 100 μm to 400 μm, and a total arc length of in the range of from 50 mm to 200 mm. Preferably, the spiral spring body has a number of turnings in the range of from 5 to 20.

The peripheral coating for the hairspring is formed from silicon dioxide, and preferably has a thickness of in the range of from 3 μm to 6 μm.

In an embodiment, the orientation angle of the <110> mono-crystalline silicon wafer to produce small variations in the overall hairspring stiffness to be used in stiffness fine-tuning. The spiral spring body preferably has a cyclically varying width along at least a portion of the total arc length based on the turning so as to compensate for the varying hairspring sectional stiffness due to the anisotropic Young's modulus on the wafer plane. The width for the <110> mono-crystalline silicon wafer may vary according to the equation:

$$b(\theta) = b_0 \sqrt[3]{1 - \frac{1}{2}\sin^2(\theta)[1 + 3\cos^2(\theta)]\left(1 - \frac{S_{12}}{S_{11}} - \frac{S_{44}}{2S_{11}}\right)}$$

Here, $S_{11}$, $S_{12}$, and $S_{44}$ are elements of the mono-crystalline silicon compliance matrix defined as 7.68, −2.14, and 12.6, respectively, with units in $10^{-12}$ $Pa^{-1}$. The term θ is the orientation angle on the wafer plane. The spiral spring body may be formed from a dry etching manufacturing technique including a deep reactive ion etching (DRIE) manufacturing technique.

In another embodiment, the longitudinal vertices formed at the intersection of the faces of the height of the spiral spring body and the faces of the width of the spiral spring body has a chamfer extending along at least a portion of the total arc length. The chamfer provides a reduction in structural stress concentration at said vertices during elastic deformation of the spiral spring body in use. The chamfers may be formed by way of wet etching.

In a second aspect, the present invention provides an oscillator for a timepiece, said oscillator including a torque-restoring element according to the first aspect, and a balance affixed to an inner terminal end of the torque-restoring element.

In a third aspect, the present invention provides a process for forming a torque-restoring element according to the first aspect, wherein the spiral spring body is formed from a dry etching manufacturing technique including a deep reactive ion etching (DRIE) manufacturing technique.

In a fourth aspect, the present invention provides a process for forming a torque restoring element according to the first aspect, wherein the width for the <110> mono-crystalline silicon wafer which varies according to the equation:

$$b(\theta) = b_0 \sqrt[3]{1 - \frac{1}{2}\sin^2(\theta)[1 + 3\cos^2(\theta)]\left(1 - \frac{S_{12}}{S_{11}} - \frac{S_{44}}{2S_{11}}\right)}.$$

In a fifth aspect, the present invention provides a mechanical oscillator for watchmaking, the mechanical oscillator comprising a torque-restoring element comprising a spiral spring body having a number N turnings with an inner terminal end for engagement with a rotational inertial element via a collet for rotation about an axis, and an outer terminal end for engagement with a stationary cock element, and having a width, a height and a total arc length; and a rotational inertial element engaged with the inner terminal end of the spiral spring element and being rotatable about said axis; wherein the spiral spring body includes a core formed from mono-crystalline silicon wafer oriented along the crystallographic axis <110>; and wherein the spiral spring body includes at least one peripheral coating of a material having a thermal elastic constant different from that of the core of the spiral spring body so as to maintain the oscillator frequency of the mechanical oscillator including the torque-restoring element substantially insensitive to variations of ambient temperature.

Preferably, the torque-restoring element is a torque-restoring element according to the first aspect.

BRIEF DESCRIPTION OF THE DRAWINGS

An example of the invention will now be described with reference to the accompanying drawings, in which.

DETAILED DESCRIPTION OF THE DRAWINGS

The present invention utilises <110> mono-crystalline silicon for the formation of a torque-restoring element, in particular for a hairspring for mechanical timepieces. The present invention and particulars are described with reference to FIGS. 1 to 3, and the advantages as provided by the present invention and parameters thereof, are described and explained with reference to FIGS. 4 to 6.

Figure 1:
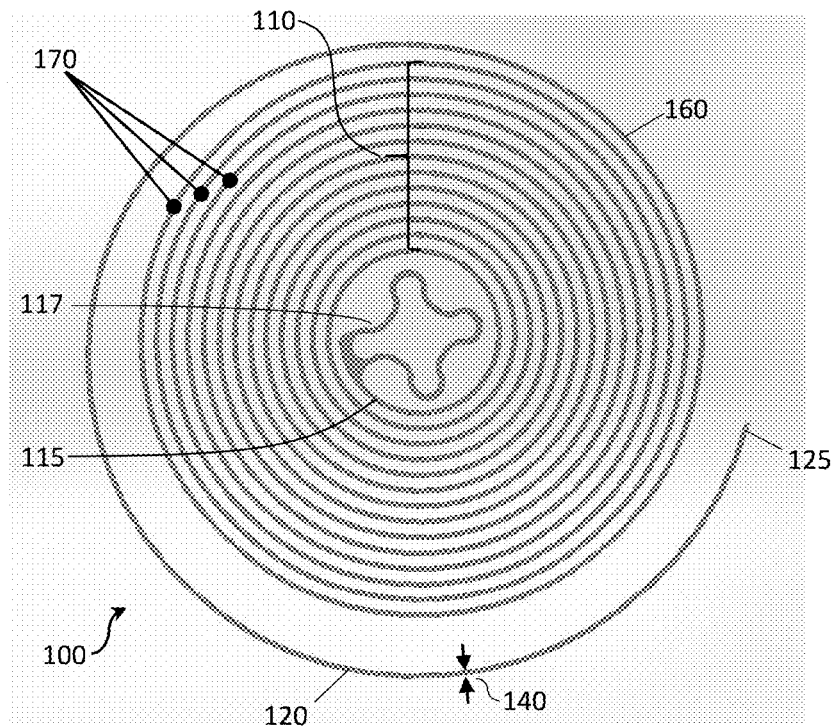
FIG. 1 depicts a diagram of a generalised torque-restoration element in accordance with the present invention as a hairspring for a mechanical timepiece in a relaxed state with all except the outermost turning consisting of the Archimedes spiral with a constant pitch.

Referring to FIG. 1 there is shown a generalized torque-restoration element as a hairspring 100 in accordance with the present invention. The hairspring 100 is used in an oscillator having an oscillator frequency and includes a spiral spring body 110 providing a main body section with an inner terminal end 115, and outer section 120 and an outer terminal end 125. The hairspring has a width 140, a height into the page and a total arc length, with turns 170.

The main body of the spiral spring body 110 forms an Archimedes spiral with constant pitch with its inner terminal end 115 for engagement connected to a collet 117. The collet 117 is in turn rigidly connected to the balance wheel, which although not shown, will be appreciated and understood by those skilled in the art to be a rotational inertia element.

The outer section 120 has a significantly increased pitch to allow room for the stud placement and an outer terminal end 125 for engagement with a stationary cock element.

The hairspring 100 is formed from mono-crystalline silicon wafer oriented along the crystallographic axis <110>, and the hairspring 100 can be formed from micro-fabrication techniques, such a dry etching manufacturing technique including a deep reactive ion etching (DRIE) manufacturing technique.

The spiral spring body 110 is formed of a substantially rectangular cross-section. In accordance with the invention, the spiral spring body 110 may have a width 140 in the range of from 20 µm to 60 µm, a height 150 in the range of from 100 µm to 400 µm, and a total arc length 160 in the range of from 50 mm to 200 mm, with a number of turnings in the range of from 5 to 20, and as shown in this particular example having 13.5 turnings. Such dimensions and sizings render the hairspring 100 applicable for timepieces such as wristwatches and the like.

Figure 2:
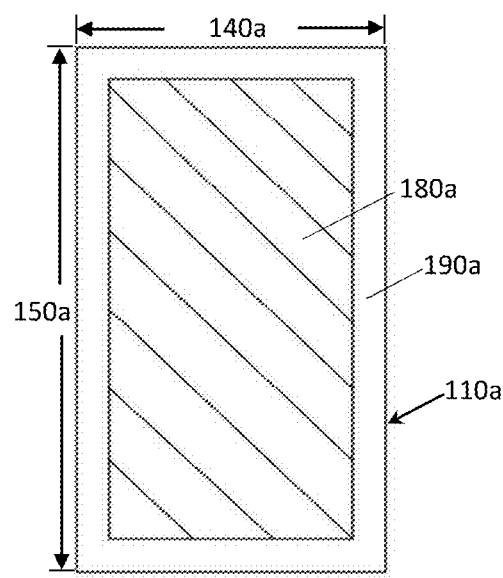
FIG. 2 shows a cross-sectional view of a first embodiment of a silicon hairspring according to the present invention, consisting of a silicon core with a silicon dioxide coating of constant thickness in accordance with the present invention.

Referring to FIG. 2, a cross-sectional view of first embodiment of a hairspring 100a is shown at an arbitrary position on the windings of the hairspring, whereby the hairspring 100a has a width 140a and a height 150a. The features and sizes of the generalized torque-restoration element of FIG. 1 are analogous to those of the present embodiment and as such, similar reference numerals denote similar features.

The spiral spring body 110a includes a core 180a which formed from mono-crystalline silicon wafer oriented along the crystallographic axis <110>. The spiral spring body 110a also includes at peripheral coating 190a of a material having a thermal elastic constant different from that of the core of the spiral spring body. The peripheral coating allows the hairspring 100a to be thermally compensated and insensitive to changes in ambient temperature. Furthermore, the provision of such a peripheral coating allows the hairspring 100a to be utilised in a regulator for a timepiece with the hairspring being engaged with a balance, so that the oscillator frequency of the oscillator is maintained and the oscillator is substantially insensitive to variations of ambient temperature.

As will be appreciated, the balance may have its own thermal expansion profile which may alter its moment of inertia with alteration in ambient temperature, and appropriate selection of a peripheral coating 190a material for the hairspring 110a allows any thermal related changes of the balance to be accounted for such that the regulator is substantially insensitive to changes in ambient temperature so as to maintain a constant oscillator frequency, and thus provide good and consistent time-keeping of a timepiece which incorporates such a regulator.

In accordance with the present invention, the peripheral coating 190a may be a silicon oxide coating, which is applied by thermal oxidation. The silicon hairspring is heated to around 1000° C. in an oxidization environment so as to effect the peripheral coating 190a. Typically, a peripheral coating 190a having a thickness of in the range of 3 µm to 6 µm is utilised in accordance with the present invention. Such a peripheral coating 190a when used with the <110> monocrystalline silicon with a hairspring 100a having geometric parameters as described with reference to FIG. 1, allows for thermal regulation and compensation of a regulator for a timepiece comprising the hairspring and a balance. Thus, the hairspring 100a of the present invention when incorporated in an oscillator for a timepiece provides with temperature stability and accurate timekeeping irrespective of fluctuations and changes in temperature.

In accordance with the invention, the cross section of the spiral spring body 110a of the hairspring 100a may either:
(i) be of a constant cross-section substantially throughout the total arc length, or
(ii) may vary along at least a portion of the total arc length.

By utilising a <110> mono-crystalline silicon wafer as defined within present invention, due to variance in Young's Modulus as discussed further below, allows for small variations in the overall hairspring stiffness to be used in stiffness fine-tuning, one of the advantages the present invention provides over the prior art such as the use of <100> and <111> mono-crystalline silicon wafer, which is also discussed further below.

In embodiments of the present invention in which the cross-section of the spiral spring body is not constant throughout the length invention, the cross section of the spiral spring body 110a of the hairspring 100a may vary depending upon requisite design parameters Due to a <110> mono-crystalline silicon wafer being anisotropic and embodied within the invention, the width and hence cross-section of the spiral spring body 110a may be varied. In embodiments of the present invention, the cross-section of the spiral spring body 110a may have a cyclically varying width 140a. This may be applied along at least a portion of the main part of the spiral spring body 110a, or substantially along the total arc length, however not necessarily along the outer turn. The width 140a of the spiral spring body 110a may vary according to the equation:

$$b(\theta) = b_0 \sqrt[3]{1 - \frac{1}{2}\sin^2(\theta)[1 + 3\cos^2(\theta)]\left(1 - \frac{S_{12}}{S_{11}} - \frac{S_{44}}{2S_{11}}\right)}$$

Figure 3:
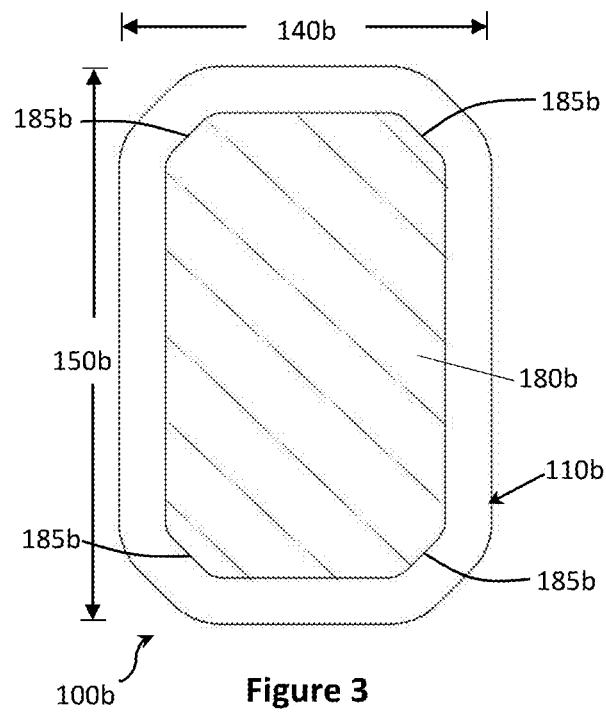
FIG. 3 shows a cross-sectional view of a second embodiment of a silicon hairspring according to the present invention, consisting of a silicon core with a silicon dioxide coating of constant thickness and chamfered longitudinal edges in accordance with the present invention.

Referring to FIG. 3, there is shown the cross-sectional view of a second embodiment of a hairspring 100b according to the present invention. As is shown, the core 180b has chamfers 185b present along longitudinal vertices formed at the intersection of the faces of the height 150b of the spiral spring body 110b and the faces of the width 140b of the spiral spring body 110b. The chamfers may extending along at least a portion of the total arc length.

The chamfers 185b provides a reduction in structural stress concentration at said vertices during elastic deformation of the spiral spring body in use, which reduces the likelihood of fatigue failure of a hairspring 100b in use. The chamfers 185b may be formed by way of wet etching, and this is discussed further below.

By way of background, the material utilised in the present invention is discussed and explained, in reference to other similar materials, and the advantages as provided by the utilisation of <110> mono-crystalline silicon in a hairspring for a timepiece are demonstrated.

There are two different types of silicon wafer, the mono-crystalline and poly-crystalline. The mono-crystalline silicon consists of a single crystal in a uniform arrangement throughout the entire wafer. Mono-crystalline silicon wafers can be further categorized as <100>, <110>, and <111> depending on the crystal orientation. The poly-crystalline silicon consists of many microscopic (nano to micro-meter scale) crystals in a random arrangement in the wafer. In general, mono-crystalline silicon wafers have more consistent material properties throughout the wafer in comparison to poly-crystalline silicon wafers.

The uniform arrangement of mono-crystalline silicon crystal virtually provides consistent material properties throughout the material in particular orientations. However, the random arrangement of the microscopic crystals in poly-crystalline silicon means that the material properties is highly dependent of the evenness of the mixing such that the macroscopic effect is roughly uniform. Furthermore, poly-crystalline silicon has visible grain boundary depending on the size of the individual crystals, negatively impacting aesthetics in mechanical timepieces where visual appeal is highly valued.

Figure 4:
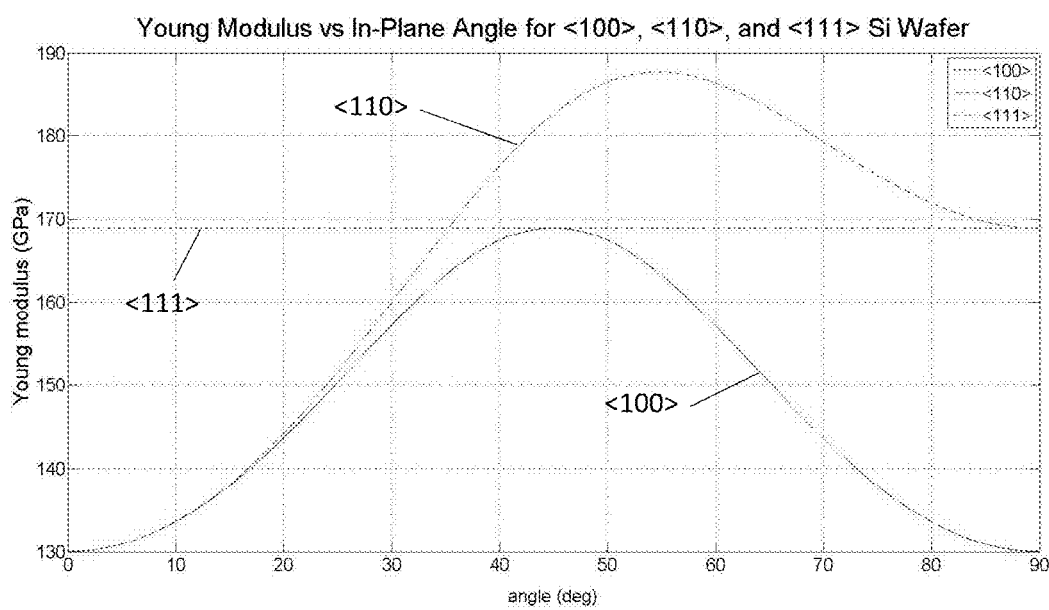
FIG. 4 shows a plot of the Young's modulus versus the orientation angle in the plane of the wafer for <100>, <110>, and <111> mono-crystalline silicon.

The key difference between the <100>, <110>, and <111> mono-crystalline silicon wafers is the Young's modulus, among other material properties, dependency on the in-plane orientation as shown FIG. 4. The <111> silicon wafer can be described as isotropic within the wafer plane because the Young's modulus is independent of the orientation. Conversely, <110> and <100> silicon wafers are anisotropic within the wafer plane because the Young's modulus varies from 130.2 to 187.5 GPa for <110> silicon wafers, and from 130.2 to 168.9 GPa for <100> silicon wafers. Each type of wafer has its strength and weakness as the material for use in silicon hairspring fabrication.

The isotropic nature of the <111> mono-crystalline silicon wafer makes the design of a silicon hairspring much simpler, a fact acknowledged in academic literature for micro-mechanical systems in general. As the silicon hairspring never bends out of the wafer plane, uniform in-plane material properties make it easy to predict the deformation when the hairspring is under stress.

However, the particular orientation of the <111> silicon wafer also makes it more difficult to cut and polish and labour intensive in manufacture, and therefore is the most expensive and rare of the three types of mono-crystalline silicon wafers.

By contrast, <100> and <110> mono-crystalline silicon wafers are simpler and cheaper to produce because the crystal orientation are better aligned with the cutting and polishing plane, especially for the <100> silicon wafer whose crystal structure is perfectly aligned with the Cartesian coordinate relative to the wafer plane.

However, the anisotropic nature of the <100> and <110> silicon wafers make the design of the silicon more complex as the Young's modulus and hence the sectional strip stiffness is sensitive to orientation.

The design of a silicon hairspring is a complex process taking several requirements into account. At its core, the hairspring stiffness must match the balance wheel inertia as to produce the desired natural frequency according to the following equation.

$$I = \frac{b^3 h}{12}$$

-continued $$k = \frac{EI}{L}$$

$$\omega_n^2 = \frac{k}{I_b}$$

Here $\omega_n$, E, b, h, L, I, k, and $I_b$ are the oscillator natural frequency, hairspring Young's modulus, hairspring cross-section width, hairspring cross-section height, hairspring total arc-length, hairspring $2^{nd}$ moment of area (rectangular cross-section), hairspring stiffness, and balance wheel moment of inertia. There are also additional constraints in the radial position of the hairspring spiral's inner and outer terminals.

The hairspring pitch-to-strip width ratio has a lower bound to prevent collision between the strips when the spiral contracts under rotation, especially for a conventional design of constant cross-section that lacks concentricity during deformation.

The difference in the angular position between the inner and outer terminals also has an effect on the stability of the stiffness over varying oscillator amplitude. The cumulative requirements place an extremely stringent constraint on freedom of hairspring design such that the hairspring geometry for nearly all hairsprings of similar stiffness is roughly identical.

The aforementioned restriction in freedom of hairspring design does not pose a severe problem for metallic hairspring because the tendency of metal to creep and deform over time also lends to its robustness and flexibility. Despite the relative lack of precision in metal hairspring manufacturing process, they can be easily bent and cut as part of the post-processing to fine-tune the stiffness to match the corresponding balance wheel inertia on a case-by-case basis.

In contrast, silicon hairspring provides greater structural stability over time, and the micro-fabrication process is a more precise manufacturing technique. The short-coming is the limited flexibility for post-processing to adjust the length and geometry of the hairspring in stiffness fine-tuning. Typically, any offset from the desired hairspring stiffness would require a complete re-design which is both technically difficult and inefficient.

The use of <100> and <110> mono-crystalline silicon wafers allow for the fine-tuning of the hairspring stiffness by rotation of the design in the wafer such that the orientation on the wafer is different. This is possible because the silicon Young's modulus is dependent on the orientation angle.

Assuming the hairspring geometry is primarily that of an Archimedes spiral, the hairspring stiffness can be described by the following equation:

$$\frac{1}{k(\theta)} = \int_{\theta_0}^{\theta_F} \frac{a\sqrt{1+\theta^2}}{IE(\theta)} d\theta$$

Here, $\theta_0$, $\theta_F$, and a are the angular position of the hairspring inner and outer terminals and Archimedes spiral pitch, respectively. Note that the Young's modulus is a function of the orientation angle $\theta$, and a change in hairspring orientation means a change in $\theta_0$ and $\theta_F$ while keeping their difference constant. Consequently, the equation demonstrates that a change in hairspring orientation on the wafer can change its stiffness.

In comparing the use of <100> and <110> mono-crystalline silicon wafers, the present invention has identified that the use of <110> mono-crystalline silicon wafers is preferable for hairspring stiffness fine-tuning.

The Young's modulus of <100> and <110> silicon wafer as a function of the in-plane can be defined as follows.

$$\frac{1}{E_{(100)}(\theta)} = S_{11} - 2\left(S_{11} - S_{12} - \frac{1}{2}S_{44}\right)\cos^2\theta\sin^2\theta$$

$$\frac{1}{E_{(110)}(\theta)} = S_{11} - \frac{1}{2}\left(S_{11} - S_{12} - \frac{1}{2}S_{44}\right)\sin^2\theta(1 + 3\cos^2\theta)$$

Here, $S_{11}$, $S_{12}$, and $S_{44}$ are elements of the mono-crystalline silicon compliance matrix defined as 7.68, −2.14, and 12.6, respectively, with units in $10^{-12}$ $Pa^{-1}$. $E_{<100>}$ varies between 130.2 and 168.9 GPa, compared to 130.2 and 187.5 GPa for $E_{<110>}$ over a 90 degree orientation interval.

This means that the sensitivity of hairspring stiffness to its orientation angle on the wafer is higher than for <110> mono-crystalline silicon wafer and thus provides more flexibility in stiffness fine-tuning, as provided by the present invention.

Another advantage identified by the present invention as provided by the use of <110> mono-crystalline silicon over <100> mono-crystalline silicon wafer is <110> mono-crystalline silicon tendency to form chamfers under wet etching techniques, which act as stress reduction mechanism.

A typical hairspring in a mechanical timepiece undergoes heavy cyclic loading as it has to bend at three to five Hertz for years. A small reduction to the hairspring's loading stress can significantly extend its lifetime. This is particularly true for a hairspring with thermal oxide coated for thermo-compensation as shown in FIG. 2 and FIG. 3.

One of the weakest points of a coated silicon hairspring is the boundary between the silicon core and silicon dioxide coating. The crystal structure of both materials are different and undergo severe adhesive stress that is made worse by thermal stress due to different thermal expansion coefficient as the hairspring cools from the coating process temperature of over 1000 C. If the stress is severe enough, the thermal oxide may de-bond from the silicon core, and thermo-compensation effect will be lost, thus resulting in a timepiece without good regulation and timekeeping.

An effective technique as provided by the present invention in stress reduction by the elimination of sharp corners which causes stress concentration as described with reference to FIG. 3.

Silicon hairspring fabrication typically involves the Deep Reactive Ion Etching (DRIE) process to create the bulk structure. However, depending on the type of mono-crystalline wafer, as provided by the present invention chamfers can be provided on hairspring edges by wet etching process. Wet etching involves the use of alkali solvent to remove silicon by immersion.

Depending on the exact type of solvent used, the etch result can be highly anisotropic based on the crystal orientation where the selectivity in the <100> crystal orientation can be up to 400 times as high as that in <110> or <111> directions. On a <110> or <111> mono-crystalline silicon wafer, wet etching alone can produce structures with trapezoidal cross-sections.

Used as a post-process after DRIE, wet etching can produce chamfers on an otherwise rectangular cross-section and thereby eliminate the sharp edges and reduce stress concentration. This is not possible with the <100> mono-crystalline silicon wafer because wet etching would primarily etch into the sidewall of the silicon hairspring cross-section, and thus not provide the benefits as provided by the present invention.

A silicon hairspring must have a coating of silicon dioxide to achieve thermo-compensation, and it can be shown that mechanism works for <110> mono-crystalline silicon wafer as utilised in accordance with the present invention.

The purpose of the silicon dioxide coating is to compensate for the reduction in oscillator frequency with raise in temperature as a result of the positive thermal expansion coefficient of the balance wheel and the negative thermal elastic constant of the silicon core of the hairspring. The dependency of the balance wheel (also known as a balance) moment of inertia on temperature can be described as follows.

$$I_b(\Delta T) = I_{b0}(1+\alpha \Delta T)^2$$

Here, $I_{b0}$, $\alpha$, and $\Delta T$ are the balance wheel moment of inertia at nominal temperature, thermal expansion coefficient of balance wheel material, and temperature difference with respect to the nominal temperature, respectively.

The thermal expansion coefficient of beryllium copper, a material typically used for balance wheel, is approximately 16 ppm/K. The temperature range typically used by the watch industry to check for thermo-compensation is 23+/−15 C.

To derive the equation for the silicon hairspring with silicon dioxide coating stiffness sensitivity to temperature, the equivalent Young's modulus for the composite structure at nominal temperature must be derived first.

$$E_0(\varsigma) = \left(1 - \frac{2\varsigma}{b}\right)^2 \left(1 - \frac{2\varsigma}{h}\right)[E_{Si,0}(\theta) - E_{SiO_2,0}] + E_{SiO_2,0}$$

Here $\varsigma$, $E_0$, $E_{Si,0}$, $E_{SiO2,0}$, b, and h are the oxide thickness, nominal Young's modulus of the composite hairspring strip, nominal Young's modulus of silicon, nominal Young's modulus of silicon dioxide, total width, and total height of the hairspring strip cross-section, respectively.

It should be noted that $E_{Si,0}$ depends on the orientation angle on the wafer and varies for <100> and <110> silicon wafers. The value of $E_{SiO2,0}$ is approximately 72.4 GPa. If the temperature is taken into account, the equation becomes as follows.

$$E_{Si}(\theta, \Delta T) = E_{Si,0}(\theta) + \varepsilon_{Si}\Delta T$$

$$E_{SiO_2}(\theta, \Delta T) = E_{SiO_2,0}(\theta) + \varepsilon_{SiO_2}\Delta T$$

$$E(\theta, \varsigma, \Delta T) = \left\{\left(1 - \frac{2\varsigma}{b}\right)^3 \left(1 - \frac{2\varsigma}{h}\right)[E_{Si,0}(\theta) - E_{SiO_2,0}] + E_{SiO_2,0}\right\} +$$

$$\left\{\left(1 - \frac{2\varsigma}{b}\right)^3 \left(1 - \frac{2\varsigma}{h}\right)[E_{Si,0}(\theta)\varepsilon_{Si} - E_{SiO_2,0}\varepsilon_{SiO_2}] + E_{SiO_2,0}\varepsilon_{SiO_2}\right\}\Delta T$$

Here, $\varepsilon_{Si}$ and $\varepsilon_{SiO2}$ are the thermal elastic constants for silicon and silicon dioxide whose values are approximately −60 ppm/K and 215 ppm/K, respectively. The hairspring stiffness can then be defined as follows.

$$\frac{1}{k(\theta, \varsigma, \Delta T)} = \int_{\theta_0}^{\theta_F} \frac{a\sqrt{1+\theta^2}}{IE(\theta, \varsigma, \Delta T)} d\theta$$

Combining with the equation for balance wheel moment of inertia yields the following for the oscillator frequency.

$$\omega_n^2(\theta, \varsigma, \Delta T) = \frac{k(\theta, \varsigma, \Delta T)}{I_b(\Delta T)}$$

If the oscillator frequency is normalized to the desired frequency for nominal temperature, it is possible to numerically determine the oxide thickness required to achieve thermo-compensation to the necessary tolerance, typically set to with +/−1 sec/day/K.

Figure 5:
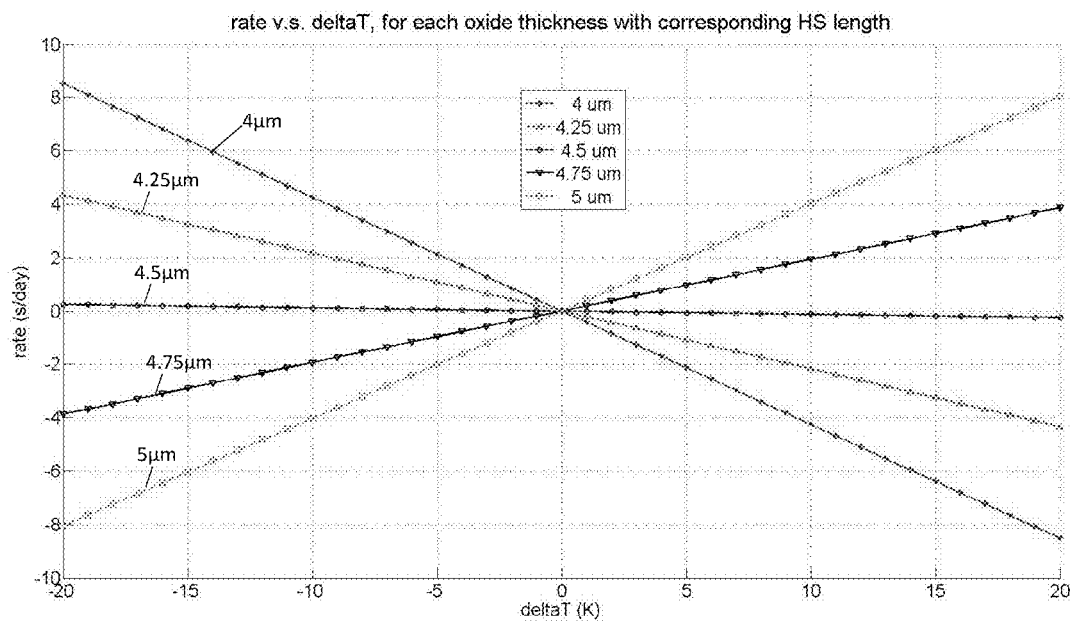
FIG. 5 shows a plot of oscillator rate versus temperature for five different silicon dioxide thickness.

FIG. 5 shows the oscillator frequency versus temperature difference plot for five different oxide thickness using <110> mono-crystalline silicon wafer in accordance with the present invention.

The width and height of the hairspring strip varies from 35 to 40 μm and 200 to 210 μm, respectively, depending on oxide thickness used. The total hairspring arc-length is approximately 130 mm, and the balance wheel moment of inertia is approximately 1.65 g*mm².

It can be seen that for an oxide thickness of 4.5 μm, the oscillator frequency varies by less than 0.1 sec/day/K over the temperature range of 5 C to 40 C which is well within the standard tolerance for thermo-compensation, when utilising <110> mono-crystalline silicon wafer in accordance with the present invention.

The anisotropic material properties of <110> mono-crystalline silicon wafer poses a challenge in the control of the hairspring strip bending at each section as the sectional stiffness depends on the orientation angle.

To maintain a constant sectional stiffness throughout the entire arc-length, in embodiments of the present invention, the hairspring width can be varied according to the Young's modulus variation as to neutralize the net stiffness variation.

Considering the hairspring sectional stiffness is proportional to the Young's modulus and to the cube of the strip width, the width can be computed to vary according to the following equation for <110> silicon wafer.

$$b(\theta) = b_0 \sqrt[3]{1 - \frac{1}{2}\sin^2(\theta)[1 + 3\cos^2(\theta)]\left(1 - \frac{S_{12}}{S_{11}} - \frac{S_{44}}{2S_{11}}\right)}$$

Using binomial theorem, the above equation can be approximated as follows.

$$b(\theta) = b_0\left\{1 - \frac{1}{6}\sin^2(\theta)[1 + 3\cos^2(\theta)]\left(1 - \frac{S_{12}}{S_{11}} - \frac{S_{44}}{2S_{11}}\right)\right\}$$

Figure 6:
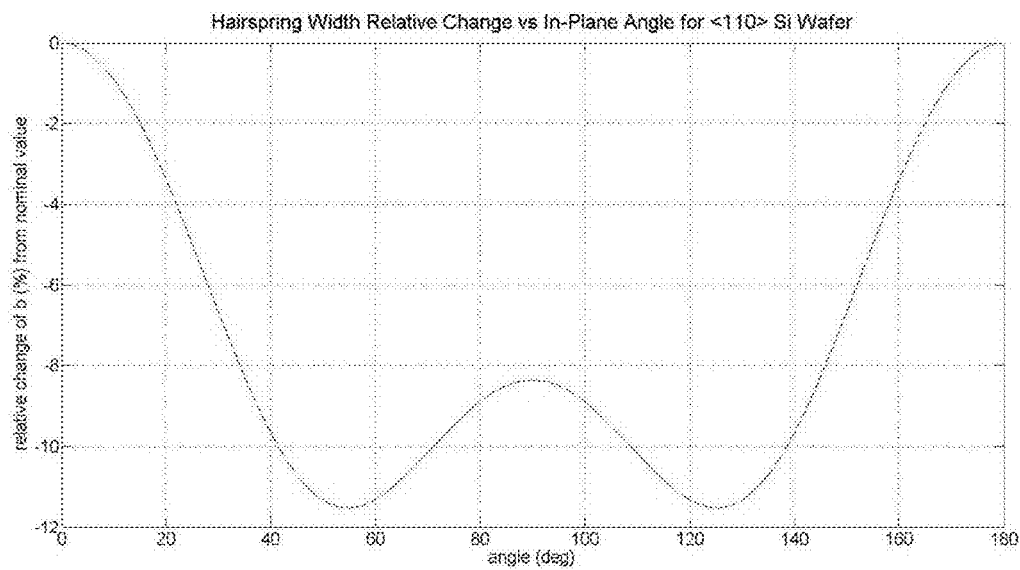
FIG. 6 shows variation of silicon hairspring width as a function of angular position to compensate for the variation in bending curvature caused by the anisotropic Young's modulus of <110> mono-crystalline silicon in accordance with the present invention.

Here, $b_0$ is the nominal width of the silicon hairspring strip. The width varies cyclically for each half-turning of the silicon hairspring. The equation assumes the nominal Young's modulus is $1/S_{11}$ or 130.2 GPa. FIG. 6 graphically shows the variation of <110> silicon hairspring width as a function of orientation angle, using <110> mono-crystalline silicon wafer in accordance with the present invention.

The present invention, by use <110> mono-crystalline silicon wafer in accordance with the present invention, provides several advantages over the prior art, including <111> and <100> monocrystalline silicon, including in that:
(i) a material of more ease of manufacture and less cost than for <111> is utilised in the present invention, providing ease and cost effective manufacture;

(ii) a material allowing greater sensitivity for adjustment than <100> is provided by the present invention, allowing for more precise adjustment;
(iii) a material allowing a chamfer to be formed on the peripheral edge is utilised, which provides the advantages of:
reducing interface stress between the vertex of the silicon hairspring and the silicon dioxide layer, hence reducing debonding and loss of thermal compensation;
reducing stress concentrations factors and localized increased stress, that reducing the likelihood of failure due to fatigue of the hairspring;
providing a hairspring having a greater resistance to failure from inherent flaws at the vertexes, and thus a longer fatigue life, a parameter required for longevity of hairsprings in timepieces;
by providing reduced localized stresses, and thus a lower likelihood of fatigue failure, such a hairspring may be utilised in high frequency applications, such as 8 to 10 Hz for example; and
Silicon hairsprings have not been used for extended periods of time such as traditional metal or metal alloy hairsprings. As such, the longevity of such articles, for example 50 years or more, cannot be determined at this point in history. Thus, providing a hairspring with lower localized stresses provides a hairspring with a greater propensity to achieve the longevity requirements of hairsprings such as those of the prior art including <100> and <111> mono-crystalline silicon.

The present invention overcomes the disadvantages of both <111> and <100> mono-crystalline silicon hairsprings, from manufacturing, selectivity of design parameters and longevity/fatigue parameters including both longevity of adherence of a thermos-compensation layer as well as longevity of the silicon core of the hairspring.

What is claimed is:

1. A torque-restoring element for an oscillator for a mechanical timepiece and having an oscillator frequency, said torque restoring element comprising:
a spiral spring body having a number N turnings with an inner terminal end for engagement with a rotational inertial element via a collet, and an outer terminal end for engagement with a stationary cock element, and having a width, a height and a total arc length;
wherein the spiral spring body includes a core formed from mono-crystalline silicon wafer oriented along the crystallographic axis <110>; and
wherein the spiral spring body includes at least one peripheral coating of a material having a thermal elastic constant different from that of the core of the spiral spring body so as to maintain the oscillator frequency an oscillator including the torque-restoring element substantially insensitive to variations of ambient temperature.

2. The torque-restoring element of claim 1, wherein the spiral spring body is of a substantially rectangular cross-section.

3. The torque-restoring element of claim 1, having a width of in the range of from 20 µm to 60 µm, a height of in the range of from 100 µm to 400 µm, and a total arc length of in the range of from 50 mm to 200 mm.

4. The torque-restoring element of claim 1, having a number of turnings in the range of from 5 to 20.

5. The torque-restoring element of claim 1, wherein the at least one of the peripheral coating for the hairspring is formed from silicon dioxide.

6. The torque-restoring element of claim 5, wherein the least one of the peripheral coating has a thickness of in the range of from 3 µm to 6 µm.

7. The torque-restoring element of claim 1, wherein the orientation angle of the <110> mono-crystalline silicon wafer to produce small variations in the overall hairspring stiffness to be used in stiffness fine-tuning.

8. The torque-restoring element of claim 1, wherein the spiral spring body has a cyclically varying width along at least a portion of the total arc length based on the turning so as to compensate for the varying hairspring sectional stiffness due to the anisotropic Young's modulus on the wafer plane.

9. The torque-restoring element of claim 8, having width for the <110> mono-crystalline silicon wafer which varies according to the equation:

$$b(\theta) = b_0 \sqrt[3]{1 - \frac{1}{2}\sin^2(\theta)[1 + 3\cos^2(\theta)]\left(1 - \frac{S_{12}}{S_{11}} - \frac{S_{44}}{2S_{11}}\right)}$$

wherein b is the width of the spiral spring body at an angular position on the spiral spring body, wherein $b_0$ is the nominal width of the spiral spring body, and wherein $S_{11}$, $S_{12}$, and $S_{44}$ are elements of the compliance matrix of the <110> mono-crystalline silicon wafer.

10. The torque-restoring element of claim 1, wherein the spiral spring body is formed from a dry etching manufacturing technique including a deep reactive ion etching (DRIE) manufacturing technique.

11. The torque restoring element of claim 1, wherein the longitudinal vertices formed at the intersection of the faces of the height of the spiral spring body and the faces of the width of the spiral spring body has a chamfer extending along at least a portion of the total arc length.

12. The torque-restoring element of claim 11, wherein said chamfer provides a reduction in structural stress concentration at said vertices during elastic deformation of the spiral spring body in use.

13. The torque-restoring element of claim 11, wherein said chamfers are formed by way of wet etching.

14. An oscillator for a timepiece, said oscillator including the torque-restoring element of claim 1, and a balance affixed to an inner terminal end of the torque-restoring element.

15. A process for forming the torque-restoring element of claim 1, wherein the spiral spring body is formed from a dry etching manufacturing technique including a deep reactive ion etching (DRIE) manufacturing technique.

16. A process for forming the torque restoring element of claim 1, wherein the width for the <110> mono-crystalline silicon wafer which varies according to the equation:

$$b(\theta) = b_0 \sqrt[3]{1 - \frac{1}{2}\sin^2(\theta)[1 + 3\cos^2(\theta)]\left(1 - \frac{S_{12}}{S_{11}} - \frac{S_{44}}{2S_{11}}\right)}$$

wherein b is the width of the spiral spring body at an angular position on the spiral spring body, wherein $b_0$ is the nominal width of the spiral spring body, and wherein $S_{11}$, $S_{12}$, and $S_{44}$ are elements of the compliance matrix of the <110> mono-crystalline silicon wafer.

17. A mechanical oscillator for watchmaking, the mechanical oscillator comprising:
   a torque-restoring element comprising a spiral spring body having a number N turnings with an inner terminal end for engagement with a rotational inertial element via a collet for rotation about an axis, and an outer terminal end for engagement with a stationary cock element, and having a width, a height and a total arc length; and
   a rotational inertial element engaged with the inner terminal end of the spiral spring element and being rotatable about said axis;
   wherein the spiral spring body includes a core formed from mono-crystalline silicon wafer oriented along the crystallographic axis <110>; and
   wherein the spiral spring body includes at least one peripheral coating of a material having a thermal elastic constant different from that of the core of the spiral spring body so as to maintain the oscillator frequency of the mechanical oscillator including the torque-restoring element substantially insensitive to variations of ambient temperature.

18. The mechanical oscillator of claim 17, wherein said torque restoration element is the torque-restoring element of claim 2.

* * * * *